(12) United States Patent
Tripathi

(10) Patent No.: US 10,411,703 B1
(45) Date of Patent: Sep. 10, 2019

(54) IMPEDANCE MATCHED CLOCK DRIVER WITH AMPLITUDE CONTROL

(71) Applicant: Samsung Electronics Co., Ltd., Suwon-si, Gyeonggi-do (KR)

(72) Inventor: Vaibhav Tripathi, San Jose, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/111,145

(22) Filed: Aug. 23, 2018

Related U.S. Application Data

(60) Provisional application No. 62/681,042, filed on Jun. 5, 2018.

(51) Int. Cl.
*H03K 17/16* (2006.01)
*H03K 19/003* (2006.01)
*H03K 19/00* (2006.01)

(52) U.S. Cl.
CPC ................................ *H03K 19/0005* (2013.01)

(58) Field of Classification Search
None
See application file for complete search history.

(56) References Cited

U.S. PATENT DOCUMENTS

| 6,300,821 | B1 | 10/2001 | Nakano |
| 7,239,169 | B2 | 7/2007 | Isa et al. |
| 7,414,442 | B2 * | 8/2008 | Uno ..................... H03K 17/22 |
| | | | 323/303 |
| 8,487,654 | B1 | 7/2013 | Chen |
| 8,577,325 | B2 | 11/2013 | Lee et al. |
| 8,659,473 | B2 | 2/2014 | Bauwelinck et al. |
| 2001/0054926 | A1 * | 12/2001 | Minami .................. H03K 5/133 |
| | | | 327/277 |

FOREIGN PATENT DOCUMENTS

CN        207020566 U     2/2018

* cited by examiner

*Primary Examiner* — Anh Q Tran
(74) *Attorney, Agent, or Firm* — Lewis Roca Rothgerber Christie LLP

(57) ABSTRACT

A clock driver circuit. In some embodiments the clock driver circuit includes an output stage, a first voltage source, and an output impedance adjusting circuit. The output stage includes a first transistor connected to the first voltage source and to an output of the drive circuit. The drive circuit is configured to operate in one of, at least, a first state, and a second state. The output impedance adjusting circuit is configured to reduce a difference between an output impedance of the drive circuit in: the first state, in which the first transistor is turned on and the first voltage source is at a first supply voltage, and the second state, in which the first transistor is turned on and the first voltage source is at a second supply voltage different from the first supply voltage.

20 Claims, 3 Drawing Sheets

IMPEDANCE MATCHED CLOCK DRIVER WITH AMPLITUDE CONTROL

CROSS-REFERENCE TO RELATED APPLICATION(S)

The present application claims priority to and the benefit of U.S. Provisional Application No. 62/681,042, filed Jun. 5, 2018, entitled "SYSTEM AND METHOD FOR PROVIDING IMPEDANCE MATCHED CLOCK DRIVER WITH BODY BIASING AND SUPPLY VOLTAGE BASED AMPLITUDE CONTROL", the entire content of which is incorporated herein by reference.

FIELD

One or more aspects of embodiments according to the present disclosure relate to clock circuits, and more particularly to an impedance matched clock driver with amplitude control.

BACKGROUND

Clock driver circuits may be used in various applications requiring clock signals with different amplitudes. Maintaining output impedance matching for different output amplitudes may be challenging.

Thus, there is a need for a clock driver circuit with good output impedance matching for different output amplitude levels.

SUMMARY

According to an embodiment of the present disclosure, there is provided a drive circuit, including: an output stage, a first voltage source, and an output impedance adjusting circuit, the output stage including: a first arm, and a second arm, the first arm including a transistor, and a resistor, the transistor having a source connected to the first voltage source, and a drain connected to a first terminal of the resistor, a second terminal of the resistor being connected to an output of the drive circuit, the drive circuit configured to operate in one of at least: a first state, and a second state, the output impedance adjusting circuit configured to reduce a difference between an output impedance of the drive circuit in: the first state, in which the transistor is turned on and the first voltage source is at a first supply voltage, and the second state, in which the transistor is turned on and the first voltage source is at a second supply voltage different from the first supply voltage.

In some embodiments: the transistor has a body terminal, and the output impedance adjusting circuit is configured to: apply a first body voltage to the body terminal when the first voltage source is at the first supply voltage, and apply a second body voltage, different from the first body voltage, to the body terminal when the first voltage source is at the second supply voltage.

In some embodiments, the second arm is connected between a second voltage source and an output of the drive circuit, the second voltage source has a third supply voltage lower than the second supply voltage, and the second supply voltage is lower than the first supply voltage.

In some embodiments, the second body voltage is less than the second supply voltage by one threshold voltage of the transistor.

In some embodiments the drive circuit further includes a control input for receiving a control signal indicating whether the first voltage source is at a voltage greater than a first limit.

In some embodiments, the output impedance adjusting circuit includes: a diode-connected transistor, a bypass transistor, a resistor, and a pull-down transistor, the diode-connected transistor connected between the first voltage source and the body terminal, the bypass transistor connected in parallel with the diode-connected transistor, the resistor connected between the drain of the pull-down transistor and the body terminal, and the source of the pull-down transistor connected to the second voltage source.

In some embodiments: the output of the drive circuit has a return loss, in the first state, of more than 10 dB, and the output of the drive circuit has a return loss, in the second state, of more than 10 dB.

In some embodiments, the second arm is connected between a second voltage source and an output of the drive circuit, the second voltage source has a third voltage lower than the second supply voltage, and the second supply voltage is lower than 0.8 times the first supply voltage.

In some embodiments, the drive circuit is configured to operate at any time in one of at least: the first state, the second state, and a third state, the output impedance adjusting circuit configured to reduce a maximum difference between an output impedance of the drive circuit in: the first state, the second state, and the third state in which the transistor is turned on and the first voltage source is at a third supply voltage different from each of the first supply voltage and the second supply voltage.

In some embodiments, the output impedance adjusting circuit includes a variable resistor in parallel with the resistor of the first arm.

According to an embodiment of the present disclosure, there is provided a drive circuit, including: an output stage, a first voltage source, and an output impedance adjusting circuit, the output stage including a first transistor connected to the first voltage source and to an output of the drive circuit, the drive circuit configured to operate in one of at least: a first state, and a second state, the output impedance adjusting circuit configured to reduce a difference between an output impedance of the drive circuit in: the first state, in which the first transistor is turned on and the first voltage source is at a first supply voltage, and the second state, in which the first transistor is turned on and the first voltage source is at a second supply voltage different from the first supply voltage.

In some embodiments, the output impedance adjusting circuit includes a variable resistor connected to the first transistor.

In some embodiments, the drive circuit includes an inverter, the inverter having: a first arm including the first transistor and a first resistor, connected in series; and a second arm including a second transistor and a second resistor, connected in series.

In some embodiments: the first transistor has a body terminal, and the output impedance adjusting circuit is configured to: apply a first body voltage to the body terminal when the first voltage source is at the first supply voltage, and apply a second body voltage, different from the first body voltage, to the body terminal when the first voltage source is at the second supply voltage.

In some embodiments: the second arm is connected between a second voltage source and an output of the drive circuit, the second voltage source has a third supply voltage lower than the second supply voltage, the second supply voltage is lower than the first supply voltage, and the second body voltage is less than the second supply voltage by one threshold voltage of the first transistor.

In some embodiments, the drive circuit further includes a control input for receiving a control signal indicating whether the first voltage source is at a voltage greater than a first limit.

In some embodiments, the output impedance adjusting circuit includes: a diode-connected transistor, a bypass transistor, a resistor, and a pull-down transistor, the diode-connected transistor connected between the first voltage source and the body terminal, the bypass transistor connected in parallel with the diode-connected transistor, the resistor connected between a drain of the pull-down transistor and the body terminal, and a source of the pull-down transistor connected to the second voltage source.

In some embodiments: the output of the drive circuit has a return loss, in the first state, of more than 10 dB, and the output of the drive circuit has a return loss, in the second state, of more than 10 dB.

In some embodiments, the second arm is connected between a second voltage source and an output of the drive circuit, the second voltage source having a third voltage lower than the second supply voltage, and the second supply voltage is lower than 0.8 times the first supply voltage.

According to an embodiment of the present disclosure, there is provided a method for operating a drive circuit, the drive circuit including a transistor connected to a first voltage source, the method including: setting the first voltage source to a first supply voltage, and supplying a voltage equal to the first supply voltage to a body terminal of the transistor; setting the first voltage source to a second supply voltage lower than the first supply voltage; and supplying a voltage less than the second supply voltage by one threshold voltage to the body terminal of the transistor.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an impedance matched clock driver with amplitude control provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
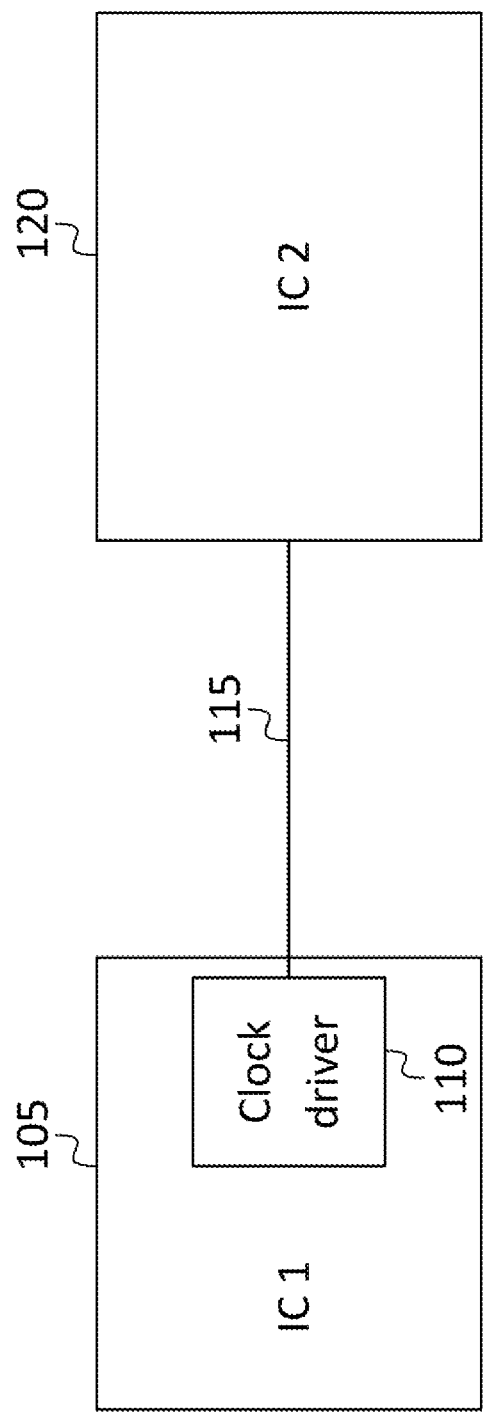
FIG. 1 is a block diagram showing clock signal transmission between integrated circuits, according to an embodiment of the present disclosure.

In various digital circuits, a clock signal may be transmitted from one portion of a circuit to another, e.g., for synchronization. Referring to FIG. 1, for example, a first integrated circuit 105 may include a clock driver 110 that transmits, over a transmission line 115 (which may be a printed circuit board (PCB) trace), a clock signal to a second integrated circuit 120. The amplitude of the clock signal that is sufficient, at the output of the clock driver 110, to result in reliable reception of the clock signal at the second integrated circuit 120 may depend on various factors, such as the length of the transmission line, or the number of other integrated circuits, in addition to the second integrated circuit 120, that also receive the clock signal.

If a relatively low amplitude clock signal is sufficient (e.g., when only one integrated circuit receives the signal, and the transmission line 115 is short), it may be advantageous to reduce the amplitude of the transmitted clock signal to a value that is near the minimum sufficient amplitude, e.g., to reduce interference (e.g., radio frequency interference) that may be produced by the clock signal and especially by its harmonics (the relative amplitude of which may be greater at high clock signal amplitude). In some circuits, a reduction in output amplitude may be achieved by reducing the positive supply voltage of the clock driver. Such a change in the positive supply voltage, however, may increase the on-resistance of one or more of the output drive transistors in the clock driver 110 and increase the output impedance of the clock driver 110, thereby degrading the output return loss (i.e., increase the magnitude of $S_{22}$).

Figure 2:
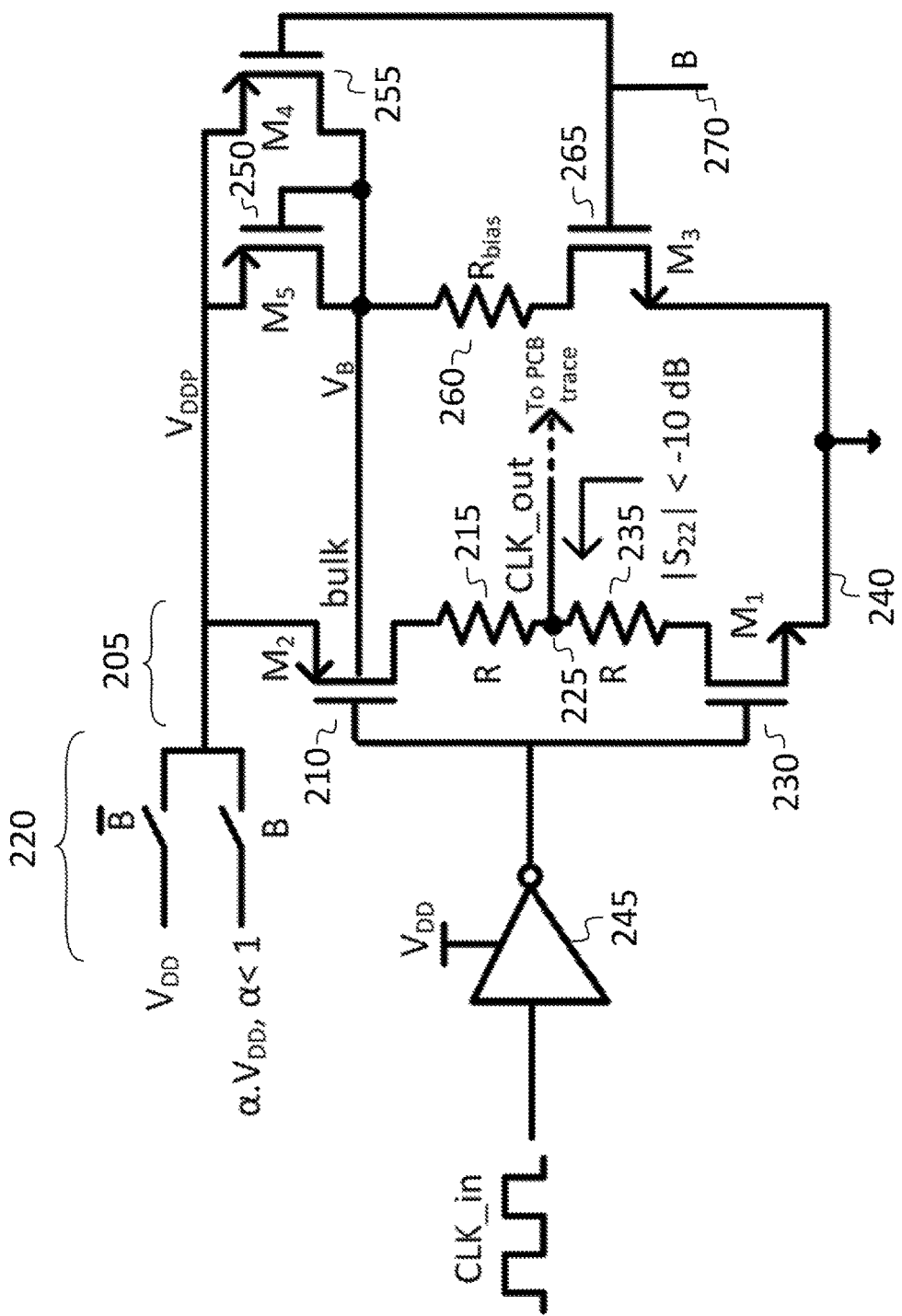
FIG. 2 is a schematic diagram of a clock driver, according to an embodiment of the present disclosure.

Referring to FIG. 2, in some embodiments, a clock driver circuit (or "drive circuit") may include an output stage 205 that includes an inverter having two output series resistors. The inverter has a first arm and a second arm, the first arm including a first transistor 210 (e.g., a P-channel metal oxide semiconductor field effect transistor (MOSFET)), and a first resistor 215, connected in series with the first transistor 210, the series combination being connected between (i) a first voltage source 220 configured to supply the positive supply voltage $V_{DDP}$ of the clock driver and (ii) the output 225 of the clock driver, such that when the first transistor 210 is turned on, the output 225 of the clock driver is pulled up through the first resistor 215. In this state, the output impedance of the clock driver may be the sum of the resistance of the first resistor 215 and the on-resistance of the first transistor 210.

The second arm may include a second transistor 230 (e.g., an N-channel MOSFET), and a second resistor 235, connected in series with the second transistor 230, the series combination being connected between (i) the negative supply voltage 240 of the clock driver (e.g., ground, as shown) and (ii) the output 225 of the clock driver, such that when the second transistor 230 is turned on, the output 225 of the clock driver is pulled down through the second resistor 235. In this state, the output impedance of the clock driver may be the sum of the resistance of the second resistor 235 and the on-resistance of the second transistor 230. The gate of the first transistor 210 and the gate of the second transistor 230 may both be connected to the output of a drive amplifier 245 so one, and only one, of the first transistor 210 and the second transistor 230 is turned on at any time, the first transistor 210 being turned on when the output of the drive amplifier 245 is low, and the second transistor 230 being turned on when the output of the drive amplifier 245 is high.

The first voltage source 220 may be configured to be adjustable, or switchable, so that the output voltage $V_{DDP}$ of the first voltage source 220 may be selected according to the clock signal amplitude to be generated, e.g., so as to produce a lower amplitude clock signal when a lower amplitude clock signal is sufficient for the circuit or circuits receiving the clock signal. The first voltage source 220 may, for example, include a single-pole double-throw (SPDT) switch as shown, the SPDT switch being connected to receive two different supply voltages, e.g., a first supply voltage, $V_{DD}$, and a second supply voltage lower than the first supply voltage (with, e.g., the second supply voltage being equal to $\alpha$ times VDD, where $\alpha$ is a positive constant less than 1). The SPDT switch may be controlled by a control signal sent to the clock driver to control whether it operates in a high amplitude state or in a low amplitude state.

As such, the clock driver circuit of FIG. 2 may be capable of operating in at least two states, including (i) a first state, in which the first transistor 210 is turned on, and the first voltage source 220 is at the first supply voltage, and (ii) a second state, in which the first transistor 210 is turned on, and the first voltage source 220 is at the second supply voltage. As mentioned above, when the first voltage source 220 is at the second supply voltage, the on-resistance of the first transistor 210 may be higher than when the first voltage source 220 is at the second supply voltage, because when the first voltage source 220 is at the second supply voltage the first transistor 210 has a lower source-gate voltage, which increases its on-resistance. As a result, if the resistance of the first resistor 215 is selected for good (i.e., high) return loss when the first voltage source 220 is at the first supply voltage, the return loss may be poor when the first voltage source 220 is at the second supply voltage, unless measures are taken to avoid such a result.

In some embodiments, an output impedance adjusting circuit is included, as shown in FIG. 2, to reduce the difference between the output impedance of the clock driver circuit in the first state and in the second state, and thereby to avoid an unacceptable degradation of return loss. The output impedance adjusting circuit includes a diode-connected transistor 250, a bypass transistor 255, a resistor 260, and a pull-down transistor 265. The diode-connected transistor 250 is connected between the first voltage source 220 and the body terminal of the first transistor 210, the bypass transistor 255 is connected in parallel with the diode-connected transistor 250, the resistor 260 is connected between the drain of the pull-down transistor 265 and the body terminal of the first transistor 210, and the source of the pull-down transistor 265 is connected to the second voltage source (e.g., ground, as shown).

The circuit includes a control input 270 for receiving a control signal (identified as "B" in FIGS. 2 and 3; its inverse is identified as "B" with an overbar) indicating whether the first voltage source 220 is at the first supply voltage or the second supply voltage (or, more generally, if the first voltage source 220 is configured to operate at more than two supply voltages, including, for example, a third supply voltage, the control signal may indicate whether the first voltage source 220 is at a voltage greater than a first limit, the first limit being, for example, equal to or about equal to the greatest voltage at which the return loss is greater when the output impedance adjusting circuit creates a state of reduced output impedance, as discussed in further detail below). The control signal may be low when the first voltage source is at the first supply voltage, and the control signal may be high when the first voltage source is at the second supply voltage.

In operation, in the first state, when the first voltage source 220 is at the first supply voltage, the control signal is low, turning on the bypass transistor 255 which then pulls the body terminal of the first transistor 210 up to the first supply voltage.

In the second state, when the first voltage source 220 is at the second supply voltage, the control signal is high, turning off the bypass transistor 255, and turning on the pull-down transistor 265. In this state, the pull-down transistor 265 pulls down the body terminal of the first transistor 210 to a voltage that, because of the diode-connected transistor 250, is one threshold voltage below the second supply voltage. This partially forward biases the body-source junction in the first transistor 210, which reduces its on-resistance and consequently increases the output return loss. The first resistor 215 may be selected to achieve a return loss that meets requirements (e.g., that exceeds 10 dB) both in the first state and in the second state. The first resistor 215 may be selected to maximize the return loss in the first state or in the second state, or as a compromise, such that the return loss is about the same in the first state and in the second state.

Because the body voltage is generated from a P-channel MOSFET device (the diode-connected transistor 250), it tracks process, voltage, and temperature (PVT) variations, and the performance of the circuit is robust against process and temperature variations. In some embodiments, for a $V_{DDP}$ of 600 mV ($\alpha$=0.65, $V_{DD}$=0.9 V), the output return loss improves from −6.6 dB (if the body terminal of the first transistor 210 is kept tied to the first voltage source 220) to −11.6 dB, when the body bias is enabled, i.e., when, in the second state, the body terminal of the first transistor 210 is connected to a voltage that is one threshold voltage below the second supply voltage. Moreover, since the output impedance adjusting circuit reduces the on-resistance of the first transistor 210, it reduces the rise time of the transmitted clock signal, which together with an improved swing also improves the phase noise performance. As a result, the phase noise in the clock signal at the output of the clock driver at 10 kHz offset may improve by 5 dB for $V_{DDP}$=0.6 V when an output impedance adjusting circuit is employed.

The first state and the second state may correspond to the high amplitude state and the low amplitude state, respectively. In some embodiments a clock driver circuit may operate in more than two states. More generally, the clock driver circuit may operate in n states (n being an integer greater than 1), each corresponding to a different respective output amplitude. In such a situation, the output impedance adjusting circuit may operate to reduce a maximum difference between an output impedance of the drive circuit in the n states, i.e., it may operate to reduce the maximum of the pairwise state output impedance differences, where each pairwise state output impedance difference is the absolute value of the difference between (i) the output impedance in one state of the n states and (ii) the output impedance in another state of the n states.

Figure 3:
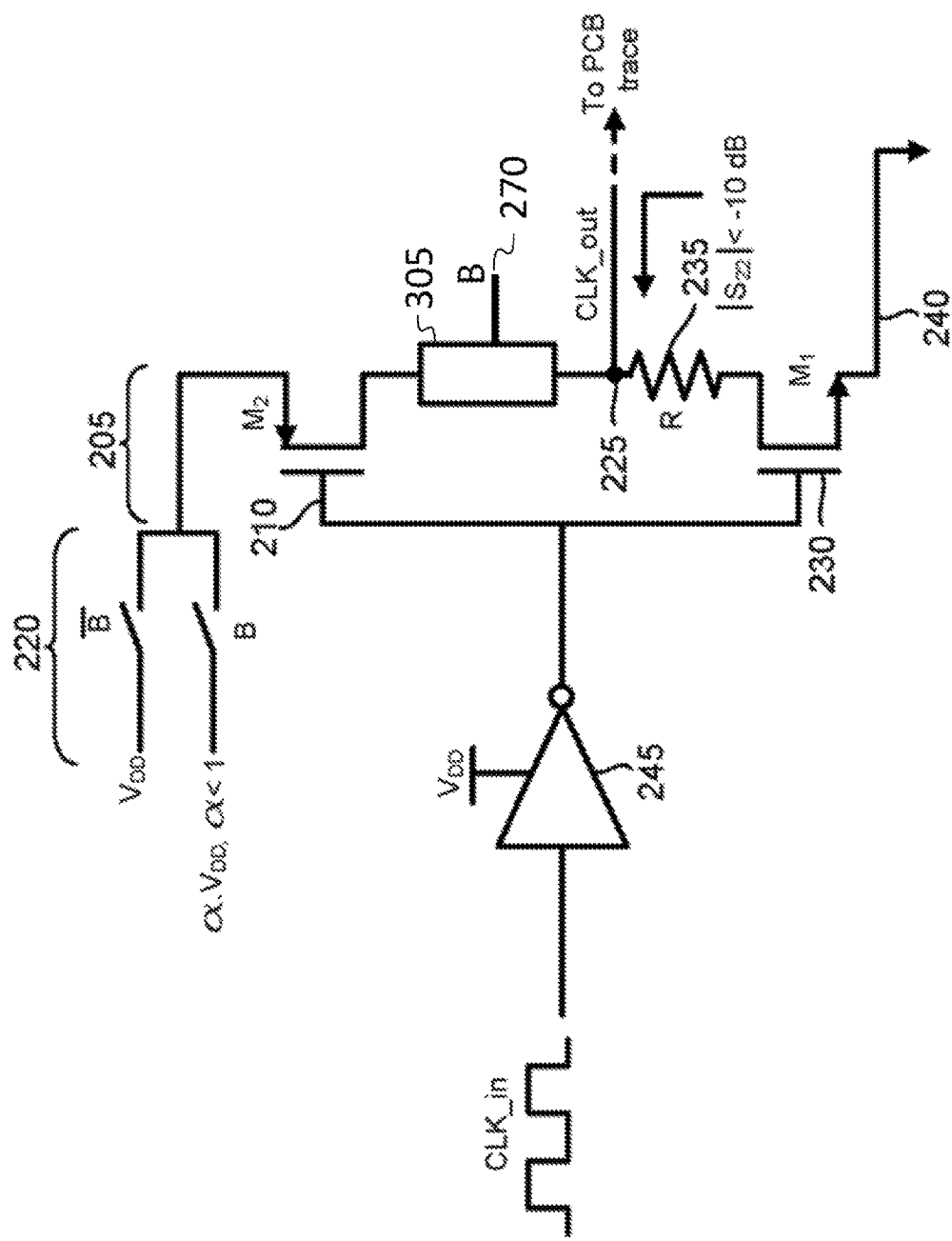
FIG. 3 is a schematic diagram of a clock driver, according to an embodiment of the present disclosure.

In some embodiments, an output impedance adjusting circuit as illustrated in FIG. 3 may be employed instead of, or in addition to, the output impedance adjusting circuit illustrated in FIG. 2. The circuit of FIG. 3 includes a variable resistor 305, which may include the first resistor 215. The variable resistor 305 is connected between the first transistor 210 and the output 225 of the clock driver; it may include one or more parallel current paths that are parallel to a current path through the first resistor 215. The first resistor 215, which is not separately illustrated in FIG. 3, is part of the variable resistor 305, and is connected, within the variable resistor 305, between the two terminals of the variable resistor 305. Each such parallel current path may, itself, be a variable resistor (the parallel combination of a fixed resistor and a variable resistor being a variable resistor), and may include, for example, a transistor and a resistor connected in series. In an embodiment with one such parallel current path, in the first state, the transistor of the parallel current path is turned off, so that current does not flow through the parallel current path. In the second state, the transistor of the parallel current path is turned on, resulting in lower output impedance, in the second state, than in the absence of the output impedance adjusting circuit (i.e., in the absence of the parallel current path). The variable resistor 305 includes a control input 270 for receiving a control signal indicating whether the first voltage source is at the first supply voltage or the second supply voltage (or, more generally, as mentioned above, the control signal may indicate whether the first voltage source is at a voltage greater than a first limit). In some embodiments, the features of FIG. 2 and of FIG. 3 are combined, so that in the second state the output impedance is reduced both by the presence of the parallel current path and by the partial forward-biasing of the body-source junction in the first transistor 210.

Some embodiments are described herein as being constructed of field effect transistors, but it will be understood that in some embodiments other transistors (e.g., bipolar transistors) may be used instead, or as well, to similar effect. As used herein, the two principal terminals of a transistor (e.g., the source and the drain, for a MOSFET, or the collector and the emitter, for a bipolar transistor) may be referred to as the "main" terminals of the transistor, and the terminal used to control the transistor (e.g., the gate, for a MOSFET, or the base, for a bipolar transistor) may be referred to as the "control" terminal of the transistor. As used herein, when a the connections to a transistor are described with terminology used for two-terminal devices, it is the connections to the main terminals of the transistor that are described. For example, a transistor that is "connected between" two nodes of a circuit has a first one of the main terminals of the transistor connected to a first one of the two nodes and a second one of the main terminals of the transistor connected to a second one of the two nodes. As another example, when two transistors are said to be connected "in series" (as in the case of a CMOS inverter), a main terminal of one of the two transistors is connected to a main terminal of the other of the two transistors. As used herein the "gate" of a bipolar transistor means the base of the bipolar transistor the "source" of a bipolar transistor means the emitter of the bipolar transistor, and the "drain" of a bipolar transistor means the collector of the bipolar transistor.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an impedance matched clock driver with amplitude control have been specifically described and illustrated herein, many modifications and variations will be apparent to those skilled in the art. Accordingly, it is to be understood that an impedance matched clock driver with amplitude control constructed according to principles of this disclosure may be embodied other than as specifically described herein. The invention is also defined in the following claims, and equivalents thereof.

What is claimed is:

1. A drive circuit, comprising:
an output stage,
a first voltage source, and
an output impedance adjusting circuit,
the output stage comprising:
a first arm, and
a second arm,
the first arm comprising
a transistor, and
a resistor,
the transistor having a source connected to the first voltage source, and a drain connected to a first terminal of the resistor,
a second terminal of the resistor being connected to an output of the drive circuit,
the drive circuit configured to operate in one of at least:
a first state, and
a second state,
the output impedance adjusting circuit configured to reduce a difference between a first output impedance and a second output impedance,
the first output impedance being an output impedance of the drive circuit in the first state, in which the transistor is turned on and the first voltage source is at a first supply voltage, and
the second output impedance being an output impedance of the drive circuit in the second state, in which the transistor is turned on and the first voltage source is at a second supply voltage different from the first supply voltage.

2. The drive circuit of claim 1, wherein:
the transistor has a body terminal, and
the output impedance adjusting circuit is configured to:
apply a first body voltage to the body terminal when the first voltage source is at the first supply voltage, and
apply a second body voltage, different from the first body voltage, to the body terminal when the first voltage source is at the second supply voltage.

3. The drive circuit of claim 2, wherein the second arm is connected between a second voltage source and an output of the drive circuit, the second voltage source has a third supply voltage lower than the second supply voltage, and the second supply voltage is lower than the first supply voltage.

4. The drive circuit of claim 3, wherein the second body voltage is less than the second supply voltage by one threshold voltage of the transistor.

5. The drive circuit of claim 4, further comprising a control input for receiving a control signal indicating whether the first voltage source is at a voltage greater than a first limit.

6. The drive circuit of claim 5, wherein the output impedance adjusting circuit comprises:
a diode-connected transistor,
a bypass transistor,
a resistor, and
a pull-down transistor,
the diode-connected transistor connected between the first voltage source and the body terminal,
the bypass transistor connected in parallel with the diode-connected transistor,
the resistor connected between the drain of the pull-down transistor and the body terminal, and
the source of the pull-down transistor connected to the second voltage source.

7. The drive circuit of claim 2, wherein:
the output of the drive circuit has a return loss, in the first state, of more than 10 dB, and
the output of the drive circuit has a return loss, in the second state, of more than 10 dB.

8. The drive circuit of claim 7, wherein the second arm is connected between a second voltage source and an output of the drive circuit, the second voltage source has a third voltage lower than the second supply voltage, and the second supply voltage is lower than 0.8 times the first supply voltage.

9. The drive circuit of claim 1, wherein the drive circuit is configured to operate at any time in one of at least:
the first state,
the second state, and
a third state,
the output impedance adjusting circuit configured to reduce a maximum difference between an output impedance of the drive circuit in:
the first state,
the second state, and
the third state in which the transistor is turned on and the first voltage source is at a third supply voltage different from each of the first supply voltage and the second supply voltage.

10. The drive circuit of claim 1, wherein the output impedance adjusting circuit comprises a variable resistor in parallel with the resistor of the first arm.

11. A drive circuit, comprising:
an output stage,
a first voltage source, and
an output impedance adjusting circuit,
the output stage comprising a first transistor connected to the first voltage source and to an output of the drive circuit,
the drive circuit configured to operate in one of at least:
a first state, and
a second state,
the output impedance adjusting circuit configured to reduce a difference between a first output impedance and a second output impedance,
the first output impedance being an output impedance of the drive circuit in the first state, in which the first transistor is turned on and the first voltage source is at a first supply voltage, and
the second output impedance being an output impedance of the drive circuit in the second state, in which the first transistor is turned on and the first voltage source is at a second supply voltage different from the first supply voltage.

12. The drive circuit of claim 11, wherein the output impedance adjusting circuit comprises a variable resistor connected to the first transistor.

13. The drive circuit of claim 11, comprising an inverter, the inverter having:
a first arm comprising the first transistor and a first resistor, connected in series; and
a second arm comprising a second transistor and a second resistor, connected in series.

14. The drive circuit of claim 13, wherein:
the first transistor has a body terminal, and
the output impedance adjusting circuit is configured to:
apply a first body voltage to the body terminal when the first voltage source is at the first supply voltage, and
apply a second body voltage, different from the first body voltage, to the body terminal when the first voltage source is at the second supply voltage.

15. The drive circuit of claim 14, wherein:
the second arm is connected between a second voltage source and an output of the drive circuit,
the second voltage source has a third supply voltage lower than the second supply voltage,
the second supply voltage is lower than the first supply voltage, and
the second body voltage is less than the second supply voltage by one threshold voltage of the first transistor.

16. The drive circuit of claim 15, further comprising a control input for receiving a control signal indicating whether the first voltage source is at a voltage greater than a first limit.

17. The drive circuit of claim 16, wherein the output impedance adjusting circuit comprises:
a diode-connected transistor,
a bypass transistor,
a resistor, and
a pull-down transistor,
the diode-connected transistor connected between the first voltage source and the body terminal,
the bypass transistor connected in parallel with the diode-connected transistor,
the resistor connected between a drain of the pull-down transistor and the body terminal, and
a source of the pull-down transistor connected to the second voltage source.

18. The drive circuit of claim 13, wherein:
the output of the drive circuit has a return loss, in the first state, of more than 10 dB, and
the output of the drive circuit has a return loss, in the second state, of more than 10 dB.

19. The drive circuit of claim 18, wherein the second arm is connected between a second voltage source and an output of the drive circuit, the second voltage source having a third voltage lower than the second supply voltage, and the second supply voltage is lower than 0.8 times the first supply voltage.

20. A method for operating a drive circuit,
the drive circuit comprising:
a transistor connected to a first voltage source, and
an output impedance adjusting circuit,
the output impedance adjusting circuit configured to reduce a difference between a first output impedance and a second output impedance,
the first output impedance being an output impedance of the drive circuit in a first state, in which the transistor is turned on and the first voltage source is at a first supply voltage, and
the second output impedance being an output impedance of the drive circuit in a second state, in which the transistor is turned on and the first voltage source is at a second supply voltage lower than the first supply voltage,
the method comprising:
setting the first voltage source to the first supply voltage, and supplying a voltage equal to the first supply voltage to a body terminal of the transistor;
setting the first voltage source to the second supply voltage; and
supplying a voltage less than the second supply voltage by one threshold voltage to the body terminal of the transistor.

* * * * *